US007272567B2

(12) United States Patent
Fejzo

(10) Patent No.: US 7,272,567 B2
(45) Date of Patent: Sep. 18, 2007

(54) SCALABLE LOSSLESS AUDIO CODEC AND AUTHORING TOOL

(76) Inventor: Zoran Fejzo, 12206 Tweed La., Los Angeles, CA (US) 90049

( * ) Notice: Subject to any disclaimer, the term of this patent is extended or adjusted under 35 U.S.C. 154(b) by 409 days.

(21) Appl. No.: 10/911,062

(22) Filed: Aug. 4, 2004

(65) Prior Publication Data

US 2005/0246178 A1 Nov. 3, 2005

Related U.S. Application Data

(60) Provisional application No. 60/556,183, filed on Mar. 25, 2004.

(51) Int. Cl.
*H04B 1/66* (2006.01)
*H03M 7/30* (2006.01)

(52) U.S. Cl. ........................ 704/500; 341/51; 375/241; 704/501

(58) Field of Classification Search ............. 704/200.1, 704/219, 500, 501, 503, 504, 229; 341/51, 341/55; 370/523; 375/240, 241
See application file for complete search history.

(56) References Cited

U.S. PATENT DOCUMENTS 4,833,718 A * 5/1989 Sprague ...................... 704/229
6,011,496 A * 1/2000 Park et al. .................... 341/55
6,023,233 A 2/2000 Craven
6,094,636 A * 7/2000 Kim .......................... 704/500
6,122,338 A * 9/2000 Yamauchi .................. 375/377
6,122,618 A * 9/2000 Park .......................... 704/500
6,226,325 B1 * 5/2001 Nakamura ................. 375/240
6,226,616 B1 5/2001 You
6,360,204 B1 * 3/2002 Li et al. ...................... 704/500
6,370,501 B1 * 4/2002 Chen et al. ................. 704/229
6,449,596 B1 * 9/2002 Ejima ......................... 704/501
6,487,535 B1 * 11/2002 Smyth et al. ............... 704/500
6,784,812 B2 8/2004 Craven
6,904,403 B1 * 6/2005 Muraki et al. ............. 704/212
7,009,533 B1 * 3/2006 Wegener ...................... 341/76
7,200,561 B2 * 4/2007 Moriya et al. ............. 704/500

OTHER PUBLICATIONS

T. Robinson. "SHORTEN: Simple Lossless and Near Lossless Waveform Compression," Tech. Report 156, Cambridege Univ, Dec. 1994.
"Surcode MLP- Owner's Manual" -Minnetonka Audio, pp. 1-43.
Hans, Mat and Schafer, Ronald, "Lossless Compression of Digital Audio" Hewlett Packard, Paolo Alto, Nov. 1999 (HPL-1999-144).

* cited by examiner

*Primary Examiner*—Martin Lerner

(57) ABSTRACT

An audio codec losslessly encodes audio data into a sequence of analysis windows in a scalable bitstream. This is suitably done by separating the audio data into MSB and LSB portions and encoding each with a different lossless algorithm. An authoring tool compares the buffered payload to an allowed payload for each window and selectively scales the losslessly encoded audio data, suitably the LSB portion, in the non-conforming windows to reduce the encoded payload, hence buffered payload. This approach satisfies the media bit rate and buffer capacity constraints without having to filter the original audio data, reencode or otherwise disrupt the lossless bitstream.

5 Claims, 16 Drawing Sheets

Multi-Channel PCM Audio 40

SCALABLE LOSSLESS AUDIO CODEC AND AUTHORING TOOL

CROSS-REFERENCE TO RELATED APPLICATIONS

This application claims benefit of priority under 35 U.S.C. 119(e) to U.S. Provisional Application No. 60/556,183 entitled "Backward Compatible Lossless audio Codec" filed on Mar. 25, 2004, the entire contents of which are incorporated by reference.

BACKGROUND OF THE INVENTION

1. Field of the Invention

This invention relates to lossless audio codecs and more specifically to a scalable lossless audio codec and authoring tool.

2. Description of the Related Art

Numbers of low bit-rate lossy audio coding systems are currently in use in a wide range of consumer and professional audio playback products and services. For example, Dolby AC3 (Dolby digital) audio coding system is a worldwide standard for encoding stereo and 5.1 channel audio sound tracks for Laser Disc, NTSC coded DVD video, and ATV, using bit rates up to 640 kbit/s. MPEG I and MPEG II audio coding standards are widely used for stereo and multi-channel sound track encoding for PAL encoded DVD video, terrestrial digital radio broadcasting in Europe and Satellite broadcasting in the US, at bit rates up to 768 kbit/s. DTS (Digital Theater Systems) Coherent Acoustics audio coding system is frequently used for studio quality 5.1 channel audio sound tracks for Compact Disc, DVD video, Satellite Broadcast in Europe and Laser Disc and bit rates up to 1536 kbit/s.

An improved codec offering 96 kHz bandwidth and 24 bit resolution is disclosed in U.S. Pat. No. 6,226,616 (also assigned to Digital Theater Systems, Inc.). That patent employs a core and extension methodology in which the traditional audio coding algorithm constitutes the 'core' audio coder, and remains unaltered. The audio data necessary to represent higher audio frequencies (in the case of higher sampling rates) or higher sample resolution (in the case of larger word lengths), or both, is transmitted as an 'extension' stream. This allows audio content providers to include a single audio bit stream that is compatible with different types of decoders resident in the consumer equipment base. The core stream will be decoded by the older decoders which will ignore the extension data, while newer decoders will make use of both core and extension data streams giving higher quality sound reproduction. However, this prior approach does not provide truly lossless encoding or decoding. Although the system of U.S. Pat. No. 6,226,216 provides superior quality audio playback, it does not provide "lossless" performance.

Recently, many consumers have shown interest in these so-called "lossless" codecs. "Lossless" codecs rely on algorithms which compress data without discarding any information. As such, they do not employ psychoacoustic effects such as "masking". A lossless codec produces a decoded signal which is identical to the (digitized) source signal. This performance comes at a cost: such codecs typically require more bandwidth than lossy codecs, and compress the data to a lesser degree.

The lack of compression can cause a problem when content is being authored to a disk, CD, DVD, etc., particularly in cases of highly un-correlated source material or very large source bandwidth requirements. The optical properties of the media establish a peak bit rate for all content that can not be exceeded. As shown in FIG. 1, a hard threshold 10, e.g., 9.6 Mbps for DVD audio, is typically established for audio so that the total bit rate does not exceed the media limit.

The audio and other data is laid out on the disk to satisfy the various media constraints and to ensure that all the data that is required to decode a given frame will be present in the audio decoder buffer. The buffer has the effect of smoothing the frame-to-frame encoded payload (bit rate) 12, which can fluctuate wildly from frame-to-frame, to create a buffered payload 14, i.e. the buffered average of the frame-to-frame encoded payload. If the buffered payload 14 of the lossless bitstream for a given channel exceeds the threshold at any point the audio input files are altered to reduce their information content. The audio files may be altered by reducing the bit-depth of one or more channels such as from 24-bit to 22-bit, filtering a channel's frequency bandwidth to low-pass only, or reducing the audio bandwidth such as by filtering information above 40 kHz when sampling at 96 kHz. The altered audio input files are re-encoded so that the payload 16 never exceeds the threshold 10. An example of this process is described in the SurCode MLP—Owner's Manual pp. 20-23.

This is a very computationally and time inefficient process. Furthermore, although the audio encoder is still lossless, the amount of audio content that is delivered to the user has been reduced over the entire bitstream. Moreover, the alteration process is inexact, if too little information is removed the problem may still exist, if too much information is removed audio data is needlessly discarded. In addition, the authoring process will have to be tailored to the specific optical properties of the media and the buffer size of the decoder.

SUMMARY OF THE INVENTION

The present invention provides an audio codec that generates a lossless bitstream and an authoring tool that selectively discards bits to satisfy media, channel, decoder buffer or playback device bit rate constraints without having to filter the audio input files, reencode or to otherwise disrupt the lossless bitstream.

This is accomplished by losslessly encoding the audio data in a sequence of analysis windows into a scalable bitstream, comparing the buffered payload to an allowed payload for each window, and selectively scaling the losslessly encoded audio data in the non-conforming windows to reduce the encoded payload, hence the buffered payload thereby introducing loss.

In an exemplary embodiment, the audio encoder separates the audio data into most significant bit (MSB) and least significant bit (LSB) portions and encodes each with a different lossless algorithm. An authoring tool writes the MSB portions to a bitsteam, writes the LSB portions in the conforming windows to the bitstream, and scales the lossless LSB portions in the conforming windows to the bitstream, and scales the lossless LSB portion of any non=conforming frames to make them conform and writes the now lossy LSB portions to the bitstream. The audio decoder decodes the MSB and LSB portions and reassembles the PCM audio data.

The audio encoder splits each audio sample into the MSB and LSB portions, encodes the MSB portion with a first lossless algorithm, encodes the LSB portion with a second lossless algorithm, and packs the encoded audio data into a scalable, lossless bitstream. The boundary point between the MSB and LSB portions is suitably established by the energy and/or maximum amplitude of samples in an analysis window. The LSB bit widths are packed into the bitstream. The LSB portion is preferably encoded so that some or all of the LSBs may be selectively discarded. Frequency extensions may be similarly encoded with MSB/LSB or entirely encoded as LSBs.

An authoring tool is used to lay out the encoded data on a disk (media). The initial layout corresponds to the buffered payload. The tool compares the buffered payload to the allowed payload for each analysis window to determine whether the layout requires any modification. If not, all of the lossless MSB and LSB portions of the lossless bitstream are written to a bitstream and recorded on the disk. If yes, the authoring tool scales the lossless bitstream to satisfy the constraints. More specifically, the tool writes the lossless MSB and LSB portion for all of the conforming windows and the headers and lossless MSB portions for the non-conforming to a modified bitstream. Based on a prioritization rule, for each non-conforming window the authoring tool then determines how many of the LSBs to discard from each audio sample in the analysis window for one or more audio channels and repacks the LSB portions into the modified bitstream with their modified bit widths. This is repeated for only those analysis windows in which the buffered payload exceeds the allowed payload.

A decoder receives the authored bitstream via the media or transmission channel. The audio data is directed to a buffer, which does not overflow on account of the authoring, and in turn provides sufficient data to a DSP chip to decode the audio data for the current analysis window. The DSP chip extracts the header information and extracts, decodes and assembles the MSB portions of the audio data. If all of the LSBs were discarded during authoring, the DSP chip translates the MSB samples to the original bit width word and outputs the PCM data. Otherwise, the DSP chip decodes the LSB portions, assembles the MSB & LSB samples, translates the assembled samples to the original bit width word and outputs the PCM data.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a lossless audio codec and authoring tool for selectively discarding bits to satisfy media, channel, decoder buffer or playback device bit rate constraints without having to filter the audio input files, reencode or to otherwise disrupt the lossless bitstream.

Figure 2:
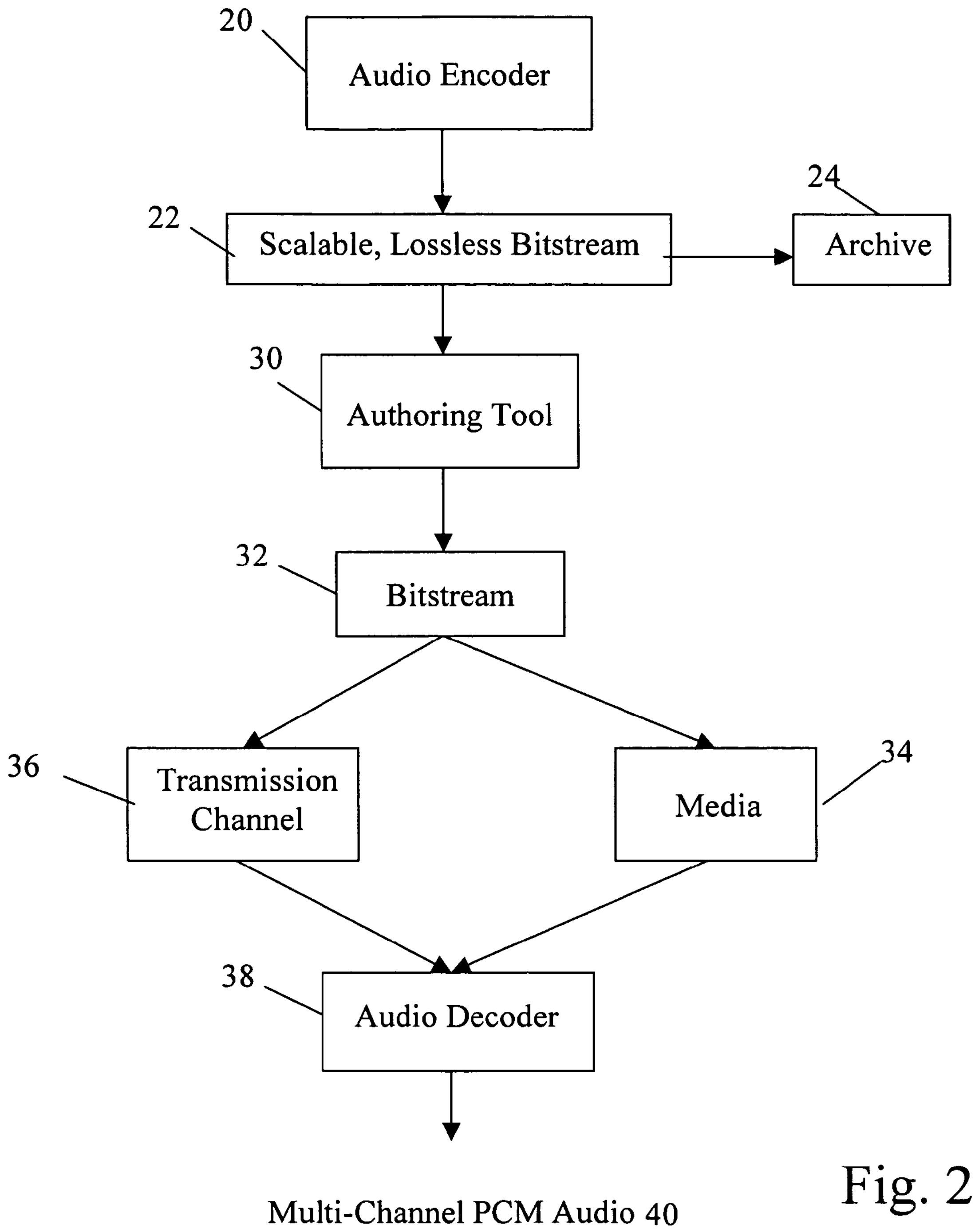
FIG. 2 is a block diagram of a lossless audio codec and authoring tool in accordance with the present invention.

As shown in FIG. 2, an audio encoder 20 losslessly encodes the audio data in a sequence of analysis windows and packs the encoded data and header information into a scalable, lossless bitstream 22, which is suitably stored in an archive 24. The analysis windows are typically frames of encoded data but as used herein the windows could span a plurality of frames. Furthermore, the analysis window may be refined into one or more segments of data inside a frame, one or more channel sets inside a segment, one or more channels in each channel set and finally one or more frequency extensions inside a channel. The scaling decisions for the bitstream can be very coarse (multiple frames) or more refined (per frequency extension per channel set per frame).

An authoring tool 30 is used to lay out the encoded data on a disk (media) in accordance with the decoder's buffer capacity. The initial layout corresponds to the buffered payload. The tool compares the buffered payload to the allowed payload for each analysis window to determine whether the layout requires any modification. The allowed payload is typically a function of the peak bit rate supported by a media (DVD disk) or transmission channel. The allowed payload may be fixed or allowed to vary if part of a global optimization. The authoring tool selectively scales the losslessly encoded audio data in the non-conforming windows to reduce the encoded payload, hence the buffered payload. The scaling process introduces some loss into the encoded data but is confined to only the non-conforming windows and is suitably just enough to bring each window into conformance. The authoring tool packs the lossless and lossy data and any modified header information into a bitstream 32. The bitstream 32 is typically stored on a media 34 or transmitted over a transmission channel 36 for subsequent playback via an audio decoder 38, which generates a single or multi-channel PCM (pulse code modulated) audio stream 40.

Figure 3:
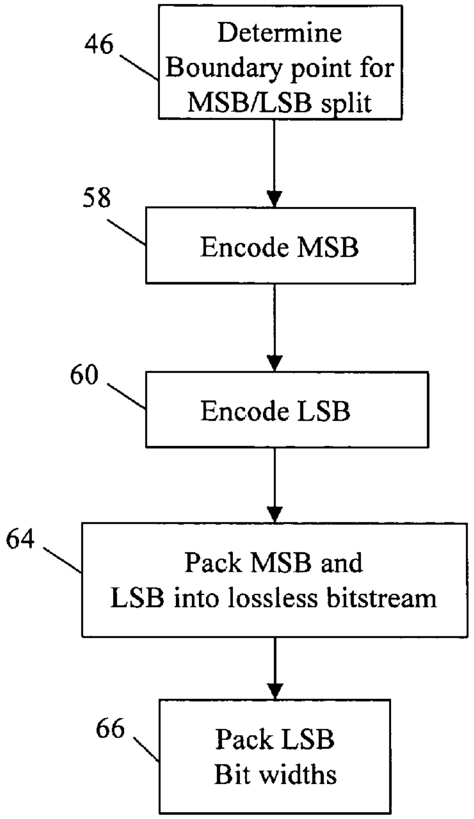
FIG. 3 is a simplified flowchart of the audio coder.
Figure 4:
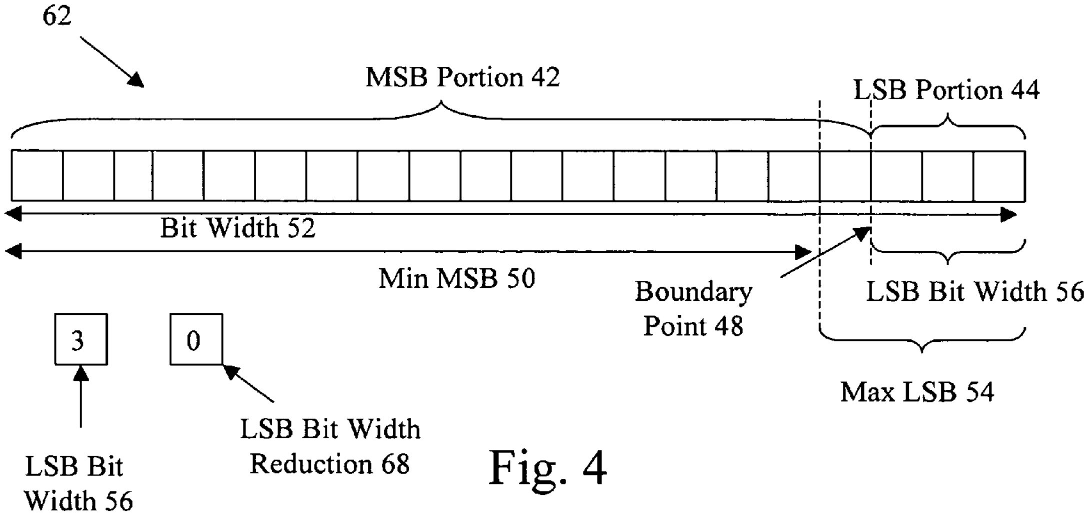
FIG. 4 is a diagram of an MSB/LSB split for a sample in the lossless bitstream.

In an exemplary embodiment as shown in FIGS. 3 and 4, the audio encoder 20 splits each audio sample into a MSB portion 42 and a LSB portion 44 (step 46). The boundary point 48 that separates the audio data is computed by first assigning a minimum MSB bit width (Min MSB) 50 that establishes a minimum coding level for each audio sample. For example, if the bit width 52 of the audio data is 20-bit the Min MSB might be 16-bit. It follows that the maximum LSB bit width (Max LSB) 54 is the Bit Width 52 minus the Min MSB 50. The encoder computes a cost function, e.g. the $L_2$ or $L_\infty$ norms, for the audio data in the analysis window. If the cost function exceeds a threshold, the encoder calculates an LSB bit width 56 of at least one bit and no more than Max LSB. If the cost function does not exceed the threshold, the LSB bit width 56 is set to zero bits. In general, the MSB/LSB split is done for each analysis window. As described above, this is typically one or more frames. The split can be further refined for each data segment, channel set, channel or frequency extension, for example. More refinement improves coding performance at the cost of additional computations and more overhead in the bitstream.

The encoder losslessly encodes the MSB portions (step 58) and LSB portions (step 60) with different lossless algorithms. The audio data in the MSB portions is typically highly correlated both temporally within any one channel and between channels. Therefore, the lossless algorithm suitably employs entropy coding, fixed prediction, adaptive prediction and joint channel decorrelation techniques to efficiently code the MSB portions. A suitable lossless encoder is described in copending application "Lossless Multi-Channel Audio Codec" filed on AUG. 4, 2004, which is hereby incorporated by reference. Other suitable lossless encoders include MLP (DVD Audio), Monkey's audio (computer applications), Apple lossless, Windows Media Pro lossless, AudioPak, DVD, LTAC, MUSICcompress, OggSquish, Philips, Shorten, Sonarc and WA. A review of many of these codecs is provided by Mat Hans, Ronald Schafer "Lossless Compression of Digital Audio" Hewlett Packard, 1999.

Conversely, the audio data in the LSB portion is highly uncorrelated, closer to noise. Therefore sophisticated compression techniques are largely ineffective and consume processing resources. Furthermore, to efficiently author the bitstream, a very simple lossless code using simplistic prediction of very low order followed by a simple entropy coder is highly desirable. In fact, the currently preferred algorithm is to encode the LSB portion by simply replicating the LSB bits as is. This will allow individual LSBs to be discarded without having to decode the LSB portion.

The encoder separately packs the encoded MSB and LSB portions into a scalable, lossless bitstream 62 so that they can be readily unpacked and decoded (step 64). In addition to the normal header information, the encoder packs the LSB bit width 56 into the header (step 66). The header also includes space for an LSB bit width reduction 68, which is not used during encode. This process is repeated for each analysis window (frames, frame, segment, channel set or frequency extension) for which the split is recalculated.

Figure 5:
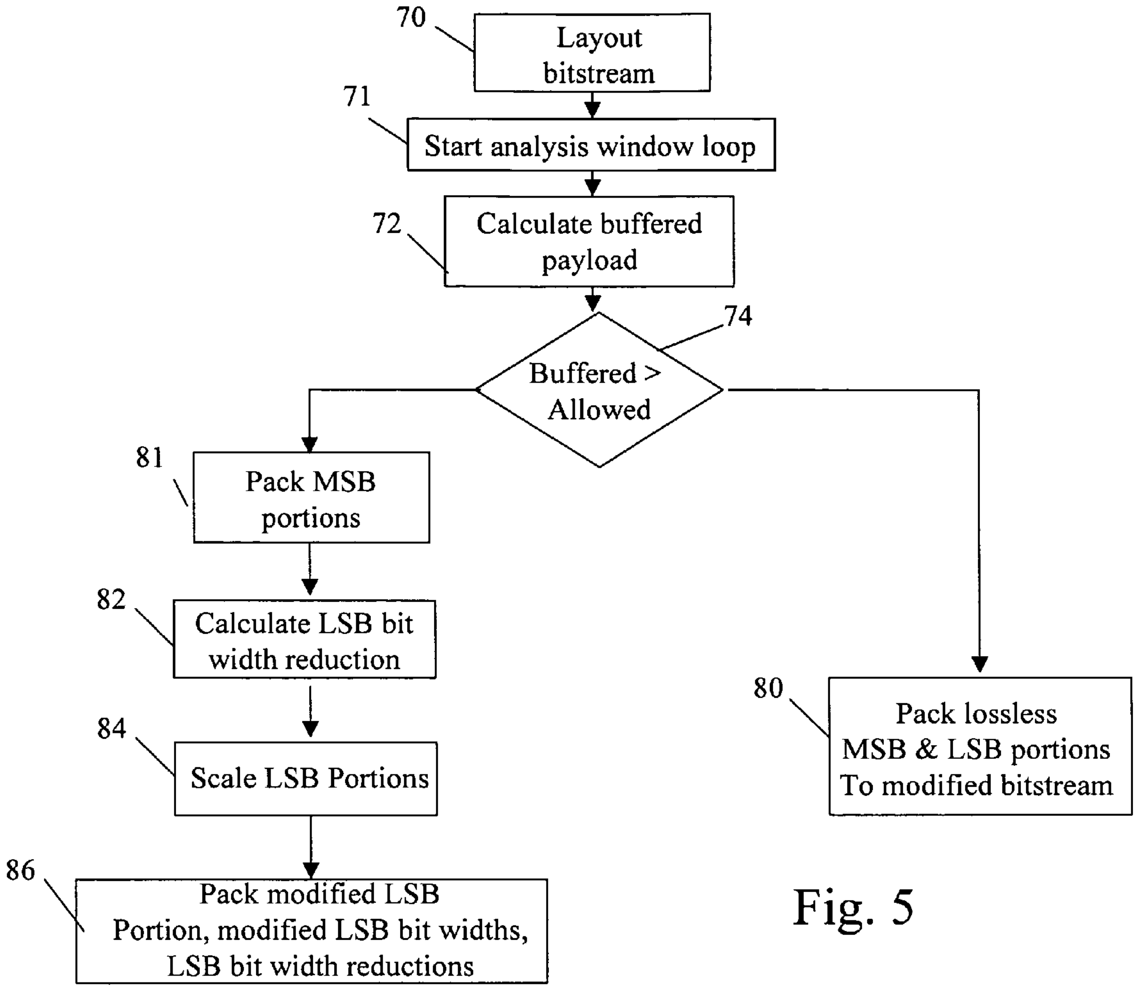
FIG. 5 is a simplified flowchart of the authoring tool.
Figure 6:
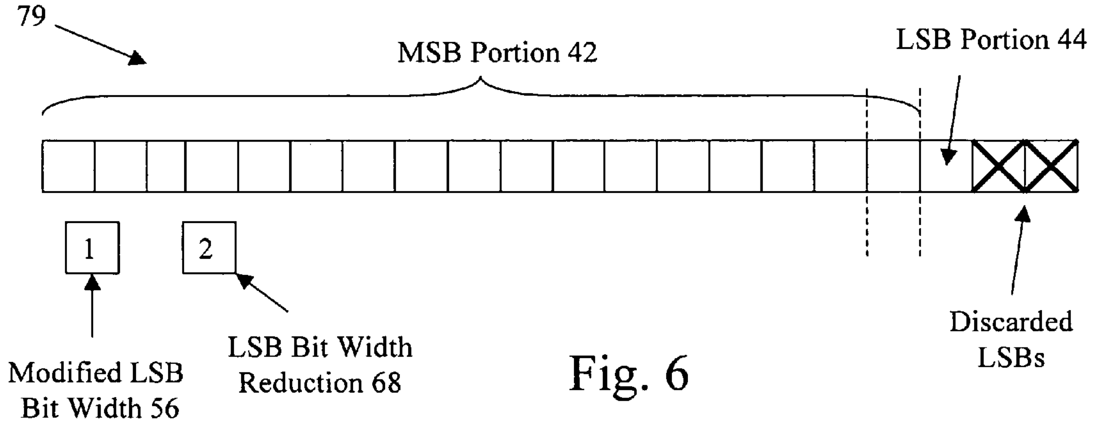
FIG. 6 is a diagram of an MSB/LSB split for a sample in the authored bitstreams.
Figure 7:
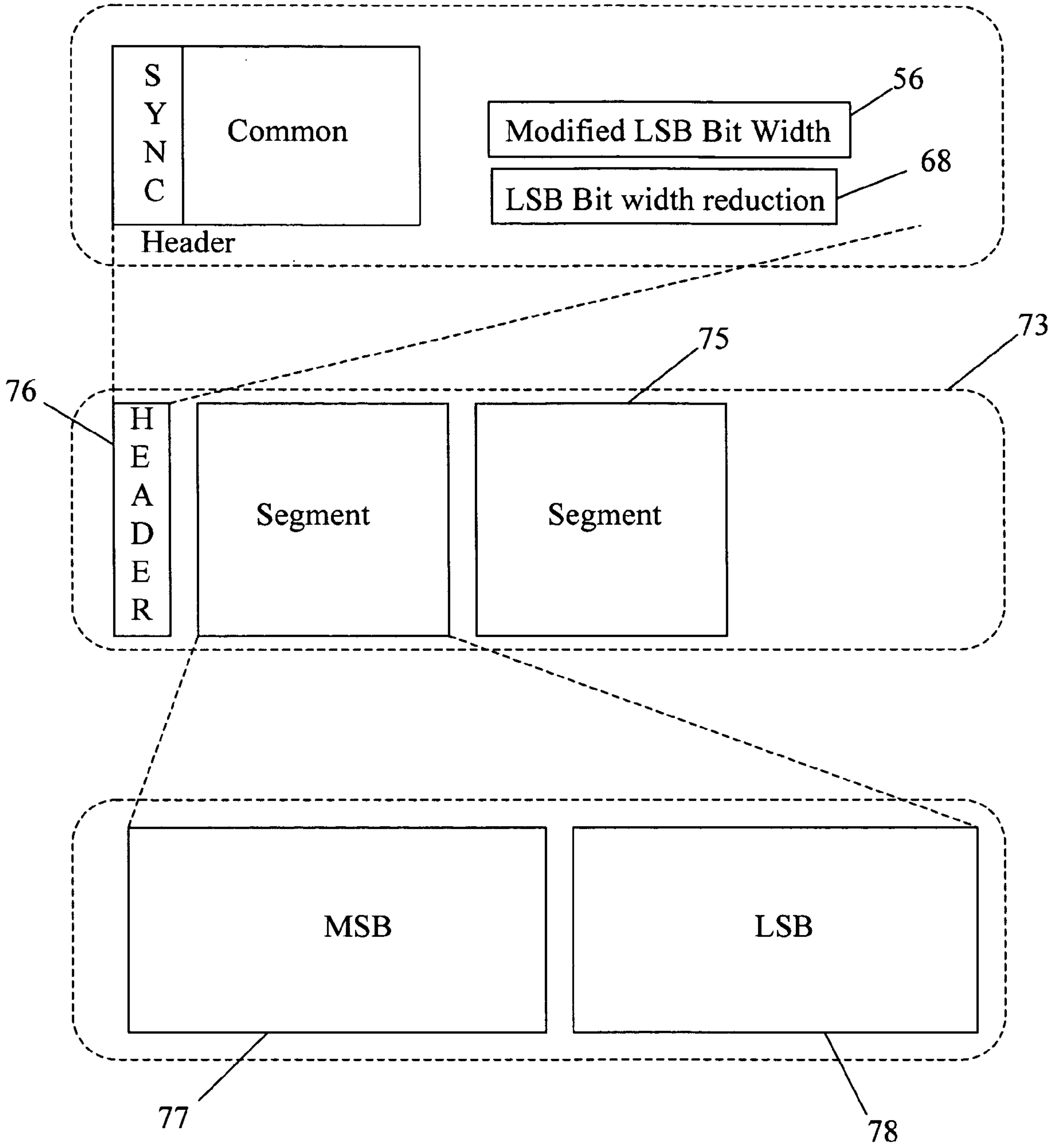
FIG. 7 is a diagram of a bitstream including the MSB and LSB portions and header information.

As shown in FIGS. 5, 6 and 7, the authoring tool 30 allows a user to make a first pass at laying out the audio and video bitstreams on the media in accordance with the decoder's buffer capacity (step 70) to satisfy the media's peak bit rate constraint. The authoring tool starts the analysis window loop (step 71), calculates an buffered payload (step 72) and compares the buffered payload to the allowed payload for the analysis window 73 to determine whether the lossless bitstream requires any scaling to satisfy the constraints (step 74). The allowed payload is determined by buffer capacity of the audio decoder and the peak bit rate of the media or channel. The encoded payload is determined by the bit width of the audio data and the number of samples in all of the data segments 75 plus the header 76. If the allowed payload is not exceeded, the losslessly encoded MSB and LSB portions are packed into respective MSB and LSB areas 77 and 78 of the data segments 75 in a modified bitstream 79 (step 80). If the allowed payload is never exceeded, the lossless bitstream is transferred directly to the media or channel.

If the buffered payload exceeds the allowed payload, the authoring tool packs the headers and losslessly encoded MSB portions 42 into the modified bitstream 79 (step 81). Based on a prioritization rule, the authoring tool calculates an LSB bit width reduction 68 that will reduce the encoded payload, hence buffered payload to at most the allowed payload (step 82). Assuming the LSB portions were simply replicated during lossless encoding, the authoring tool scales the LSB portions (step 84) by preferably adding dither to each LSB portion so as to dither the next LSB bit past the LSB bit width reduction, and then shifting the LSB portion to the right by the LSB bit width reduction to discard bits. If the LSB portions were encoded, they would have to be decoded, dithered, shifted and reencoded. The tool packs the now lossy encoded LSB portions for the now conforming windows into the bitstream with the modified LSB bit widths 56 and the LSB bit width reduction 68 and a dither parameter (step 86).

As shown in FIG. 6, the LSB portion 44 has been scaled from a bit width of 3 to a modified LSB bit width 56 of 1-bit. The two discarded LSBs 88 match the LSB bit width reduction 68 of 2 bits. In the exemplary embodiment, the modified LSB bit width 56 and LSB bit width reduction 68 are transmitted in the header to the decoder. Alternately, either of these could be omitted and the original LSB bit width transmitted. Any one of the parameters is uniquely determined by the other two.

Figure 1:
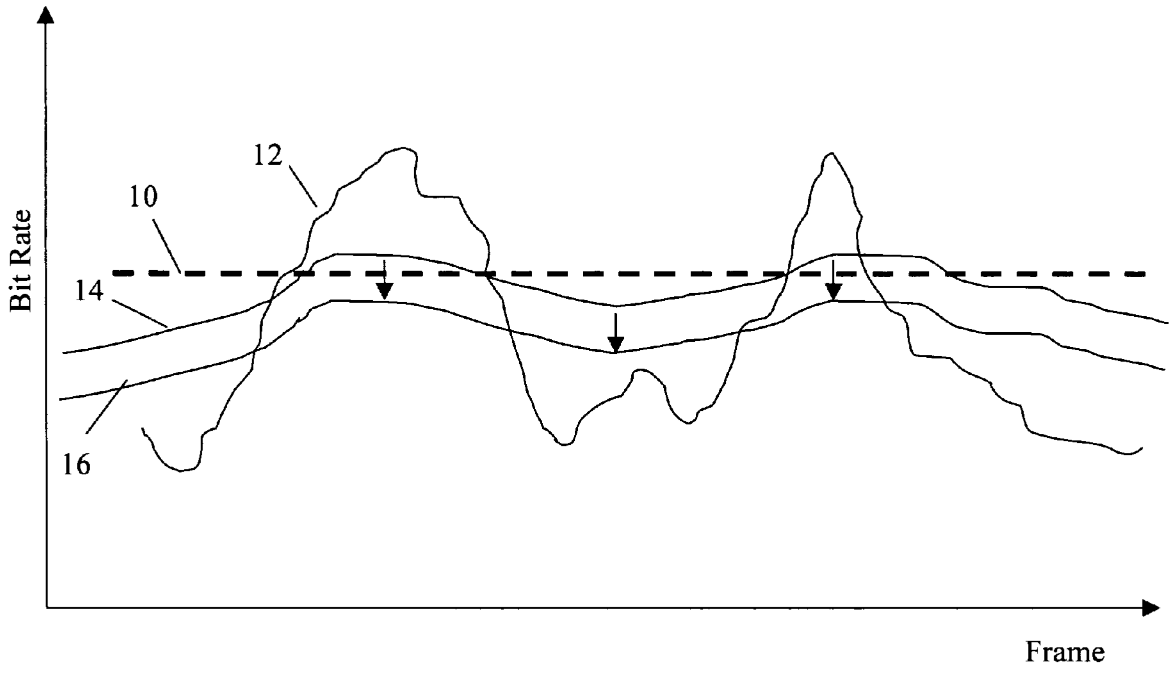
Fig. 1 (Prior Art)
FIG. 1, as described above, is a plot of bit rate and payload for a lossless audio channel versus time.
Figure 8:
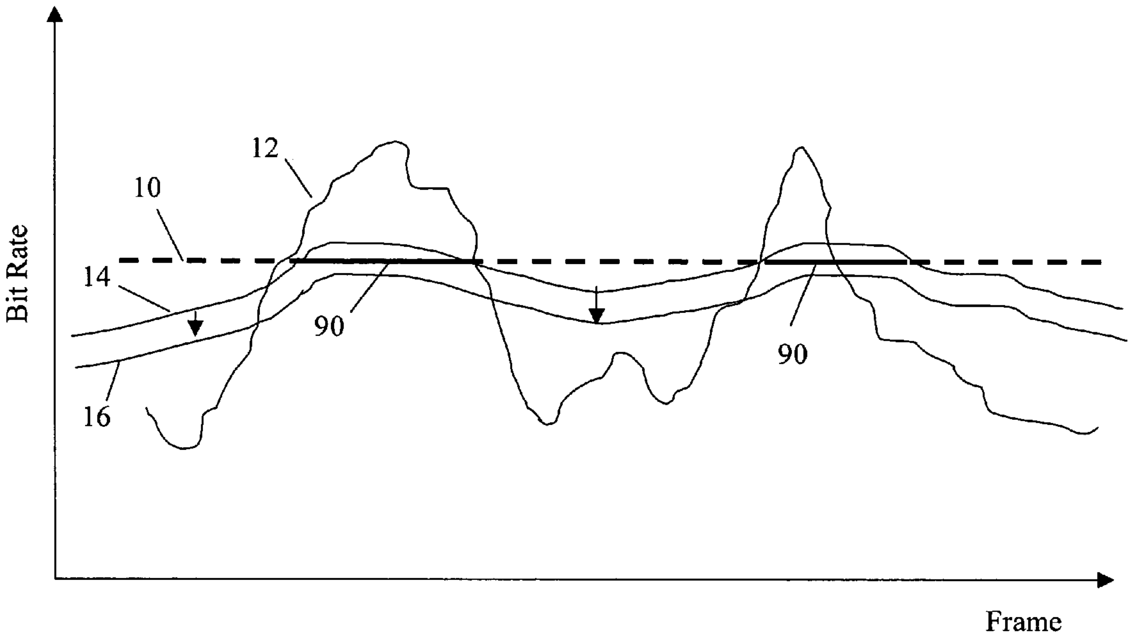
FIG. 8 is a plot of payload for the lossless and authored bitstreams.

The benefits of the scalable, lossless encoder and authoring tool are best illustrated by overlaying the buffered payload 90 for the authored bitstream on FIG. 1 as is done in FIG. 8. Using the known approach of altering the audio files to remove content and then simply reencoding with the lossless coder, the buffered payload 14 was effectively shifted downward to a buffered payload 16 that is less than the allowed payload 10. To ensure that the peak payload is less than the allowed payload, a considerable amount of content is sacrificed across the entire bitstream. By comparison, the buffered payload 90 replicates the original losslessly buffered payload 14 except in those few windows (frames) where the buffered payload exceeds the allowed payload. In these areas, the encoded payload, hence buffered payload is reduced just enough to satisfy the constraint and preferably no more. As a result, the payload capacity is utilized more efficiently and more content is delivered to the end user without having to alter the original audio files or reencode.

Figure 9:
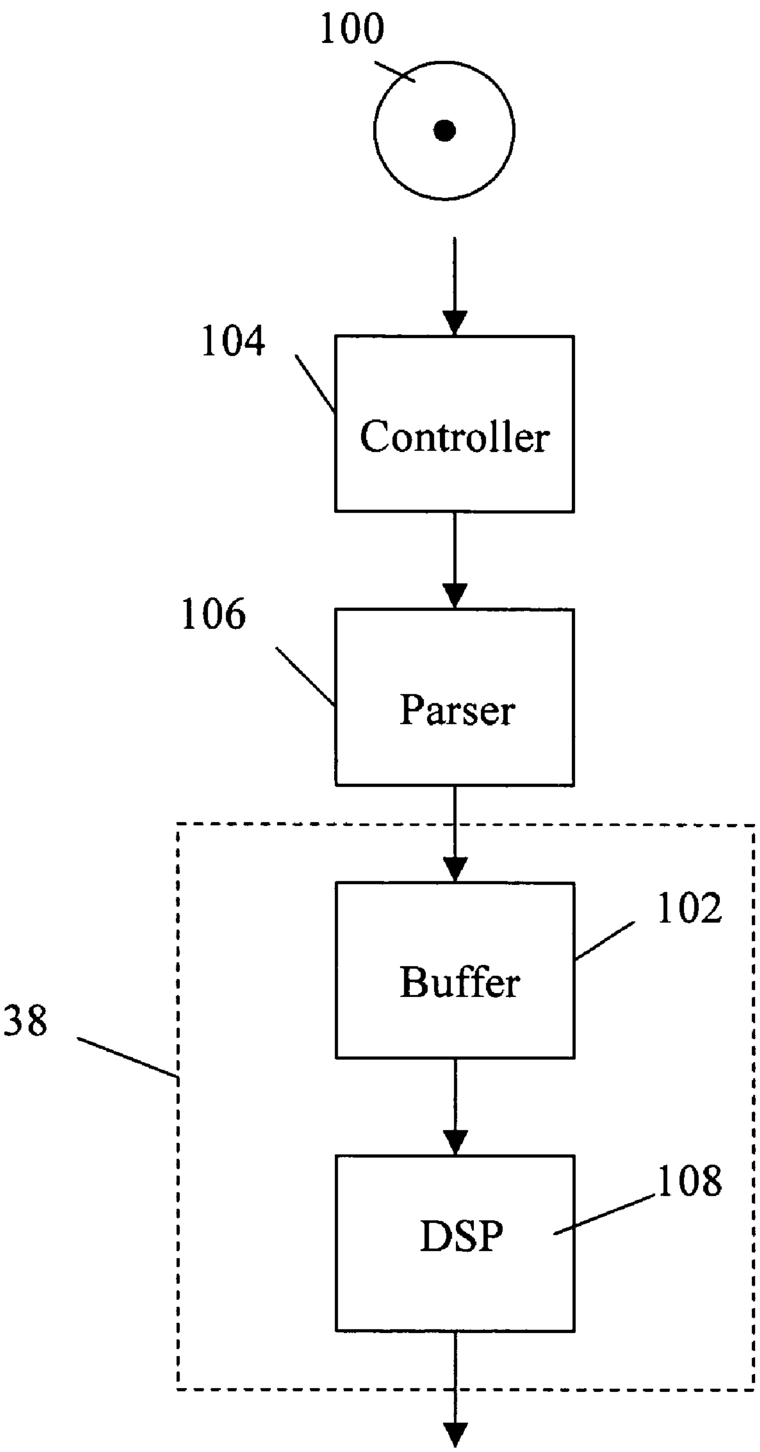
FIG. 9 is a simple block diagram of an audio decoder.
Figure 10:
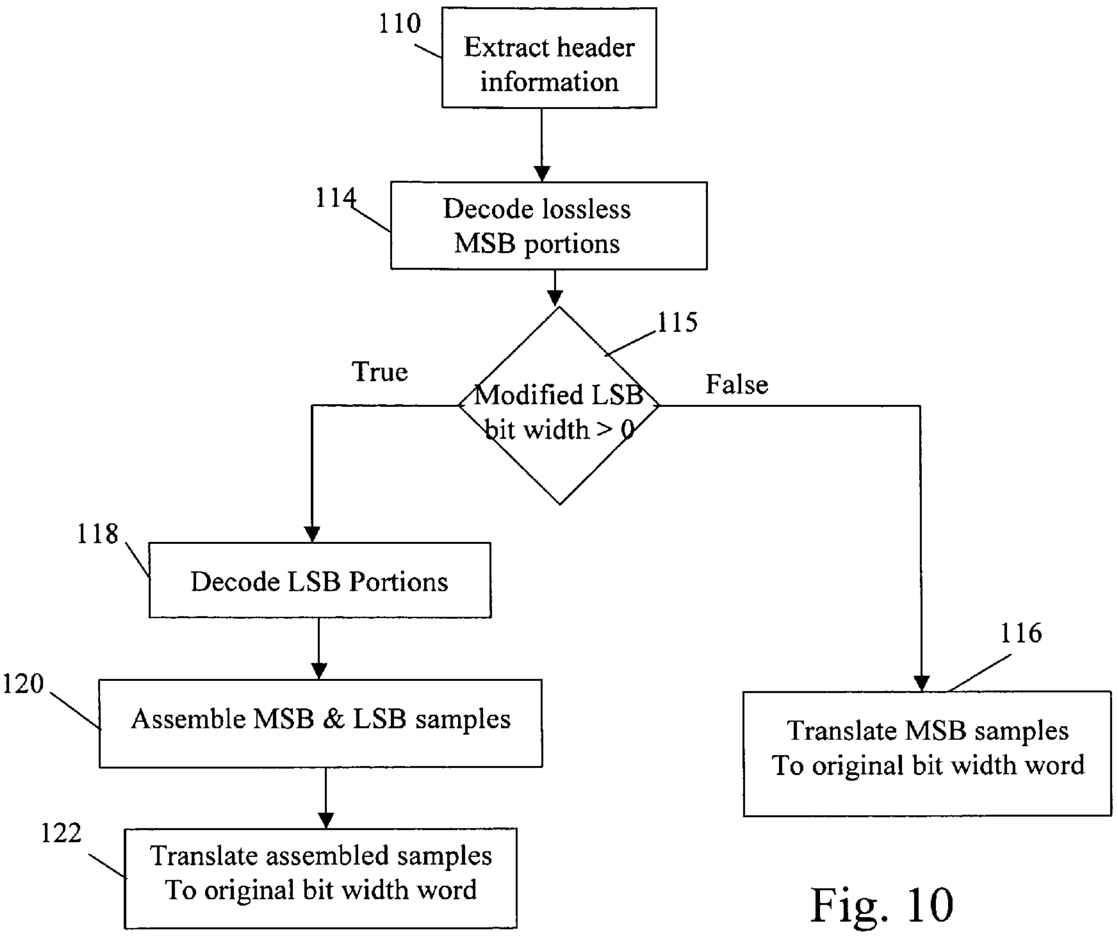
FIG. 10 is a flowchart of the decoding process.
Figure 11:
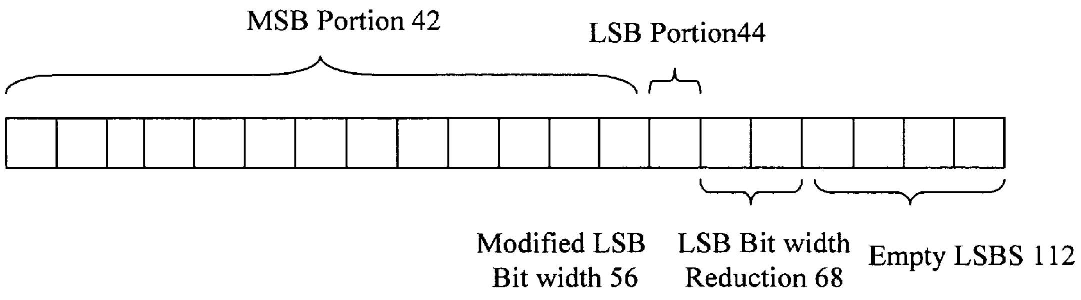
FIG. 11 is a diagram of an assembled bitstream.

As shown in FIGS. 9, 10 and 11, the audio decoder 38 receives an authored bitstream via a disk 100. The bitstream is separated into a sequence of analysis windows, each including header information and encoded audio data. Most of the windows include losslessly encoded MSB and LSB portions, the original LSB bit widths and LSB bit width reductions of zero. To satisfy the payload constraints set by the peak bit rate of the disk 100 and the capacity of the buffer 102, some of the windows include the losslessly encoded MSB portions and lossy LSB portions, the modified bit widths of the lossy LSB portions, and the LSB bit width reductions.

A controller 104 reads the encoded audio data from the bitstream on the disk 100. A parser 106 separates the audio data from the video and streams the audio data to the audio buffer 102, which does not overflow on account of the authoring. The buffer in turn provides sufficient data to a DSP chip 108 to decode the audio data for the current analysis window. The DSP chip extracts the header information (step 110) including the modified LSB bit widths 56, LSB bit width reduction 68, a number of empty LSBs 112 from an original word width and extracts, decodes and assembles the MSB portions of the audio data (step 114). If all of the LSBs were discarded during authoring or original LSB bit width was 0 (step 115), the DSP chip translates the MSB samples to the original bit width word and outputs the PCM data (step 116). Otherwise, the DSP chip decodes the lossless and lossy LSB portions (step 118), assembles the MSB & LSB samples (step 120), and, using the header information, translates the assembled samples to the original bit width word (step 122).

Multi-Channel Audio Codec & Authoring Tool

Figure 12:
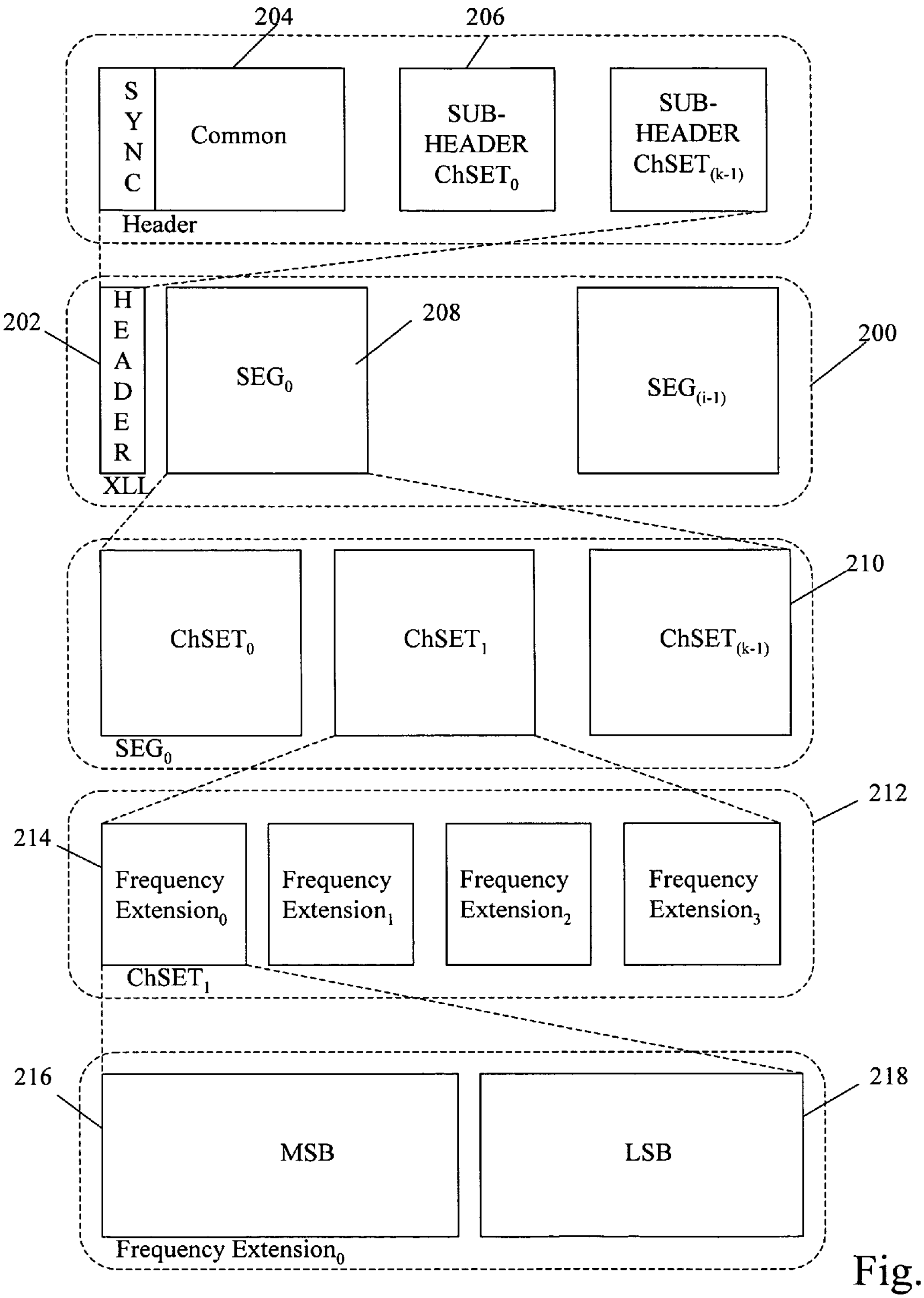
FIGS. 12-15 illustrate the bitstream format, encoding, authoring, and decoding for a particular embodiment.

An exemplary embodiment of an audio codec and authoring tool for an encoded audio bitstream presented as a sequence of frames is illustrated in FIGS. 12-15. As shown in FIG. 12, each frame 200 comprises a header 202 for storing common information 204 and sub-headers 206 for each channel set that store the LSB bit widths and LSB bit width reductions, and one or more data segments 208. Each data segment comprises one or more channel sets 210 with each channel set comprising one or more audio channels 212. Each channel comprises one or more frequency extensions 214 with at least the lowest frequency extension including encoded MSB and LSB portions 216, 218. The bitstream has a distinct MSB and LSB split for each channel in each channel set in each frame. The higher frequency extensions may be similarly split or entirely encoded as LSB portions.

Figure 13A:
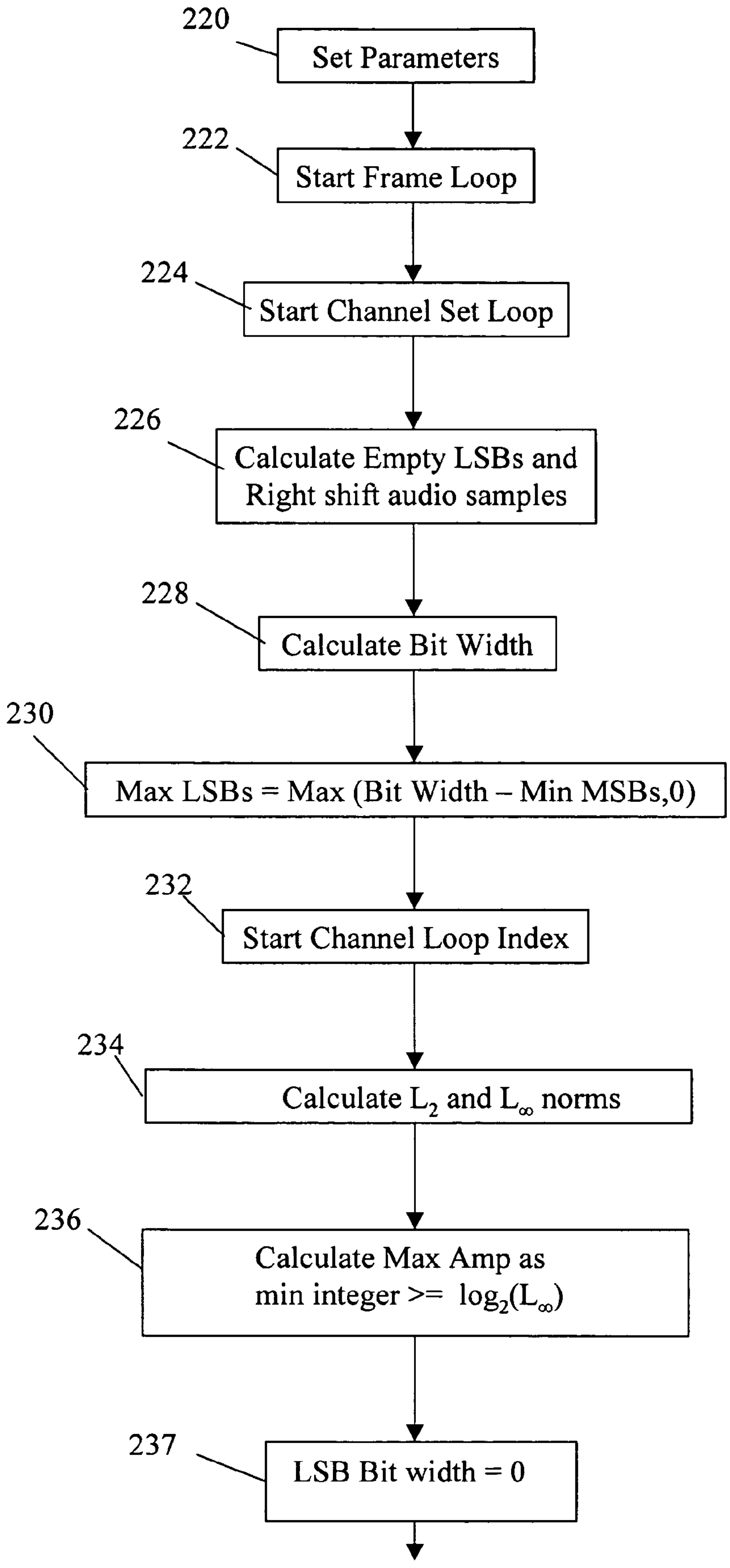
Figure 13B:
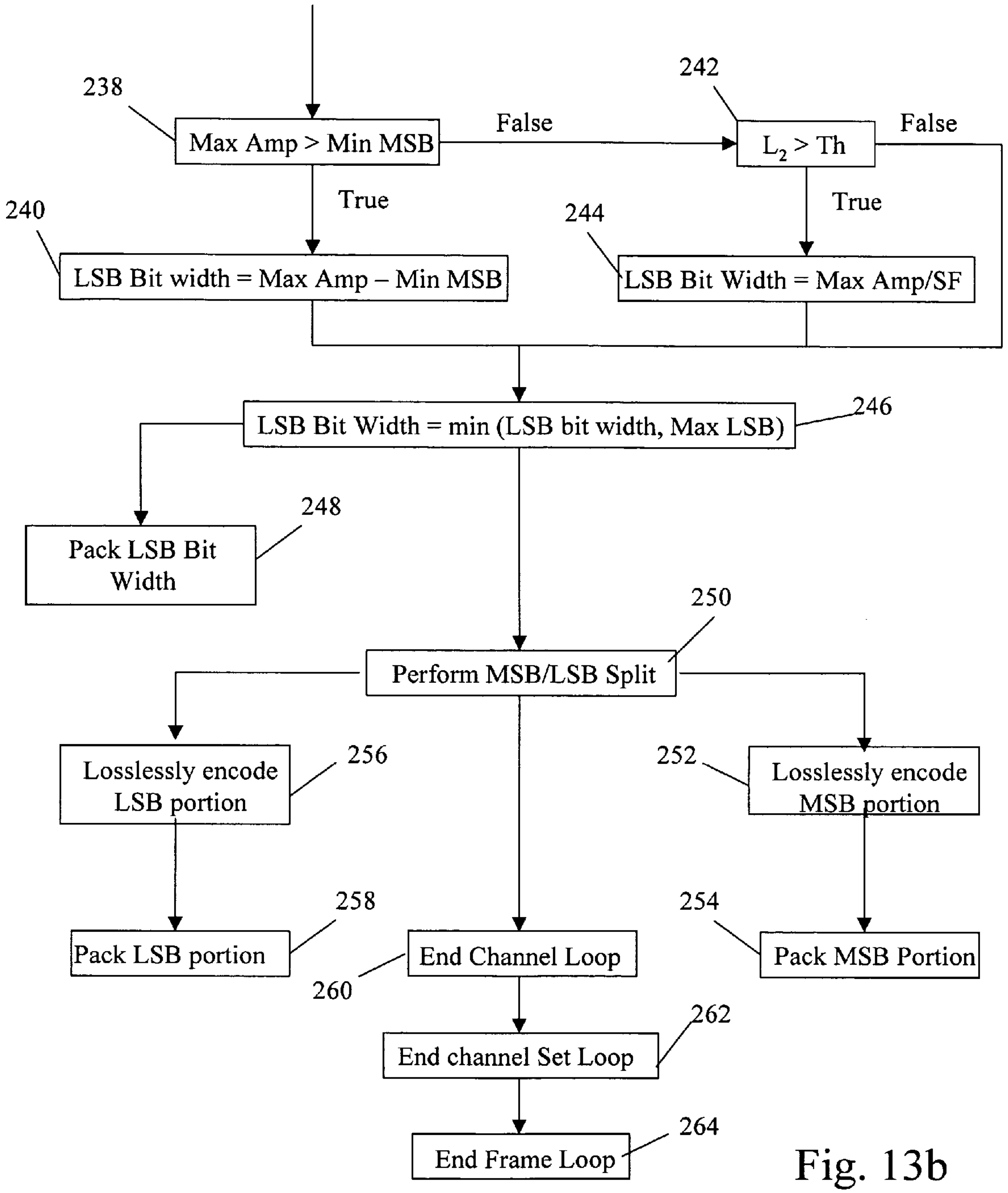

The scalable lossless bitstream from which this bitstream is authored is encoded as illustrated in FIGS. 13*a* and 13*b*. The encoder sets the bit width of the original word (24-bit), the Min MSB (16-bit), a threshold (Th) for the squared L2 norm and a scale factor (SF) for that norm (step 220). The encoder starts the frame loop (step 222) and the channel set loop (step 224). Because the actual width of the audio data (20-bit) may be less than the original word width, the encoder calculates the number of empty LSBs (24−20=4) (min number of "0" LSBs in any PCM sample in the current frame) and right shifts every sample by that amount (step 226). The bit width of the data is the original bit width (24) minus the number of empty LSBs (4) (step 228). The encoder then determines the maximum number of bits (Max LSBs) that will allow to be encoded as part of the LSB portion as Max(Bit Width-Min MSB,0) (step 230). In the current example, the Max LSBS=20−16=4 bits.

To determine the boundary point for splitting the audio data into MSB and LSB portions, the encoder starts the channel loop index (step 232) and calculates the $L_\infty$ norm as the maximum absolute amplitude of the audio data in the channel and the squared L2 norm as the sum of the squared amplitudes of the audio data in the analysis window (step 234). The encoder sets a parameter Max Amp as the minimum integer greater than or equal to $\log_2(L_\infty)$ (step 236) and initializes the LSB bit width to zero (step 237). If the Max Amp is greater than the Min MSB (step 238), the LSB bit width is set equal to the difference of the Max Amp and Min MSB (step 240). Otherwise, if the L2 norm exceeds the Threshold (small amplitude but considerable variance) (step 242), the LSB bit width is set equal to the Max Amp divided by the Scale Factor, typically >1 (step 244). If both tests are false, the LSB bit width remains zero. In other words, to maintain the minimum encode quality, e.g. Min MSB, no LSBs are available. The encoder clips the LSB bit width at the Max LSB value (step 246) and packs the value into the sub-header channel set (step 248).

Once the boundary point has been determined, i.e. the LSB bit width, the encoder splits the audio data into the MSB and LSB portions (step 250). The MSB portion is losslessly encoded using a suitable algorithm (step 252) and packed into the lowest frequency extension in the particular channel in the channel set of the current frame (step 254). The LSB portion is losslessly encoded using a suitable algorithm, e.g. simple bit replication (step 256) and packed (step 258).

This process is repeated for each channel (step 260) for each channel set (step 262) for each frame (step 264) in the bitstream. Furthermore, the same procedure may be repeated for higher frequency extensions. However, because these extensions contain much less information, the Min MSB may be set to 0 so that it is all encoded as LSBs.

Figure 14:
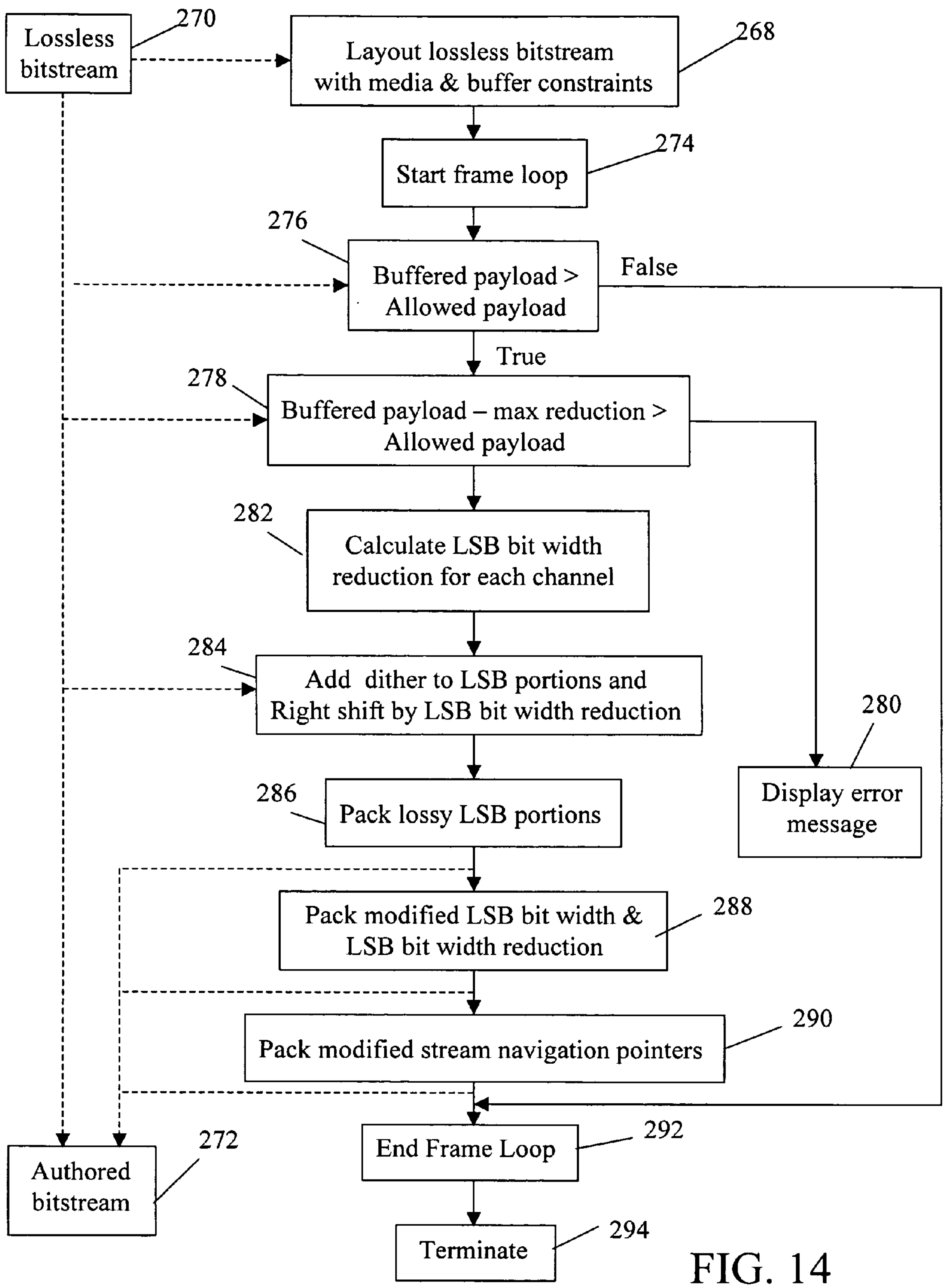

Once the scalable lossless bitstream is encoded for certain audio content, an authoring tool creates the best bitstream it can that satisfies the peak bit rate constraints of the transport media and the capacity of the buffer in the audio decoder. As shown in FIG. 14, a user attempts to layout the lossless bitstream 268 on the media to conform to the bit rate and buffer capacity constrains (step 270). If successful, the lossless bitstream 268 is written out as the authored bitstream 272 and stored on the media. Otherwise the authoring tool starts the frame loop (step 274) and compares the buffered payload (buffered average frame-to-frame payload) to the allowed payload (peak bit rate) (step 276). If the current frame conforms to the allowed payload, the losslessly encoded MSB and LSB portions are extracted from the lossless bitstream 268 and written to the authored bitstream 272 and the frame is incremented.

If the authoring tool encounters a non-conforming frame in which the buffered payload exceeds the allowed payload, the tool computes the maximum reduction that can be achieved by discarding all of the LSB portions in the channel set and subtracts it from the buffered payload (step 278). If the minimum payload is still too big the tool displays an error message that includes the amount of excess date and frame number (step 280). In this case either the Min MSB shall be reduced or the original audio files shall be altered and re-encoded.

Otherwise, the authoring tool calculates an LSB bit width reduction for each channel in the current frame based on a specified channel prioritization rule (step 282) such that:

Bit Width Reduction[nCh]<LSB bit width[nCh] for nCh=0, . . . AllChannels−1, and

Buffered payload[nfr]−Σ(Bit Width Reduction[nCh}* NumSamplesin Frame)< Allowed Payload [nFr]

The reduction of the LSB bit widths by these values will ensure that the frame conforms to the allowed payload. This is done with a minimum amount of loss being introduced into the non-conforming frames and without otherwise affecting the lossless conforming frames.

The authoring tool adjusts the encoded LSB portions (assuming bit replication encoding) for each channel by adding dither to each LSB portion in the frame to dither the next bit and then right shifting by the LSB bit width reduction (step 284). Adding dither is not necessary but is highly desirable in order to decorrelate the quantization errors and also make them decorrelated from the original audio signal. The tool packs the now lossy scaled LSB portions (step 286), the modified LSB bit widths and LSB bit width reductions for each channel (step 288) and the modified stream navigation points (step 290) into the authored bitstream. If dither is added, a dither parameter is packed into the bitstream. This process is then repeated for each frame (step 292) before terminating (step 294).

Figure 15A:
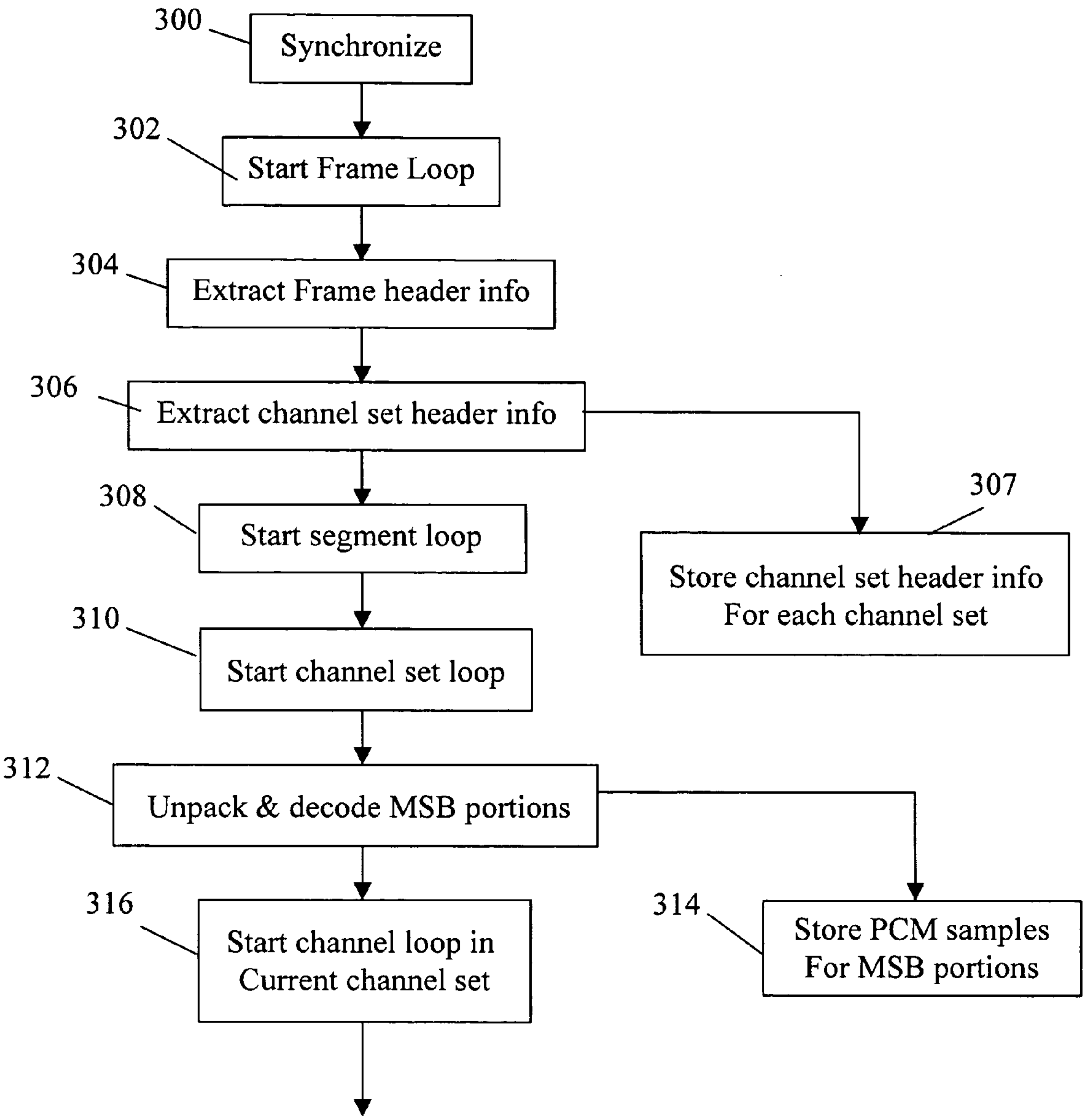
Figure 15B:
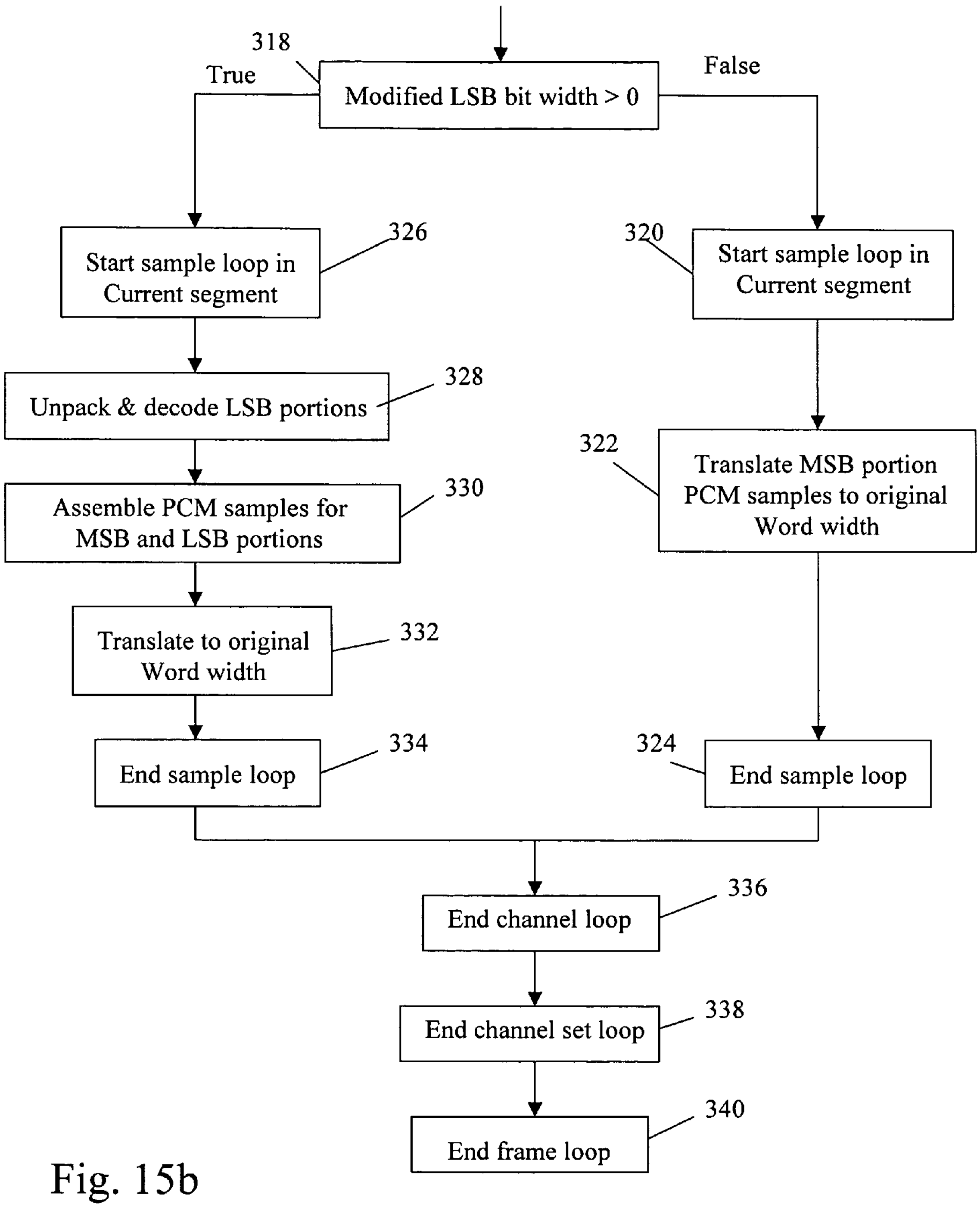

As shown in FIGS. 15*a* and 15*b*, a suitable decoder synchronizes to the bitstream (step 300) and starts a frame loop (step 302). The decoder extracts the frame header information including the number of segments, number of samples in a segment, number of channel sets, etc (step 304) and extracts the channel set header information including the number of channels in the set, number of empty LSBs, LSB bit width, LSB bit width reduction for each channel set (step 306) and stores it for each channel set (step 307).

Once the header information is available, the decoder starts the segment loop (step 308) and channel set loop (step 310) for the current frame. The decoder unpacks and decodes the MSB portions (step 312) and stores the PCM samples (step 314). The decoder then starts the channel loop in the current channel set (step 316) and proceeds with the encoded LSB data.

If the modified LSB bit width does not exceed zero (step 318), the decoder starts the sample loop in the current segment (step 320), translates the PCM samples for the MSB portion to the original word width (step 322) and repeats until the sample loop terminates (step 324).

Otherwise, the decoder starts the sample loop in the current segment (step 326), unpacks and decodes the LSB portions (step 328) and assembles PCM samples by appending the LSB portion to the MSB portion (step 330). The decoder then translates the PCM sample to the original word width using the empty LSB, modified LSB bit width and LSB bit width reduction information from the header (step 332) and repeats the steps until the sample loop terminates (step 334). To reconstruct the entire audio sequence, the decoder repeats these steps for each channel (step 336) in each channel set (step 338) in each frame (step 340).

Backward Compatible Scalable Audio Codec

The scalability properties can be incorporated into a backward compatible lossless encoder, bitstream format and decoder. A "lossy" core code stream is packed in concert with the losslessly encoded MSB and LSB portions of the audio data for transmission (or recording). Upon decoding in a decoder with extended lossless features, the lossy and lossless MSB streams are combined and the LSB stream is appended to construct a lossless reconstructed signal. In a prior-generation decoder, the lossless MSB and LSB extension streams are ignored, and the core "lossy" stream is decoded to provide a high-quality, multichannel audio signal with the bandwidth and signal-to-noise ratio characteristic of the core stream.

Figure 16A:
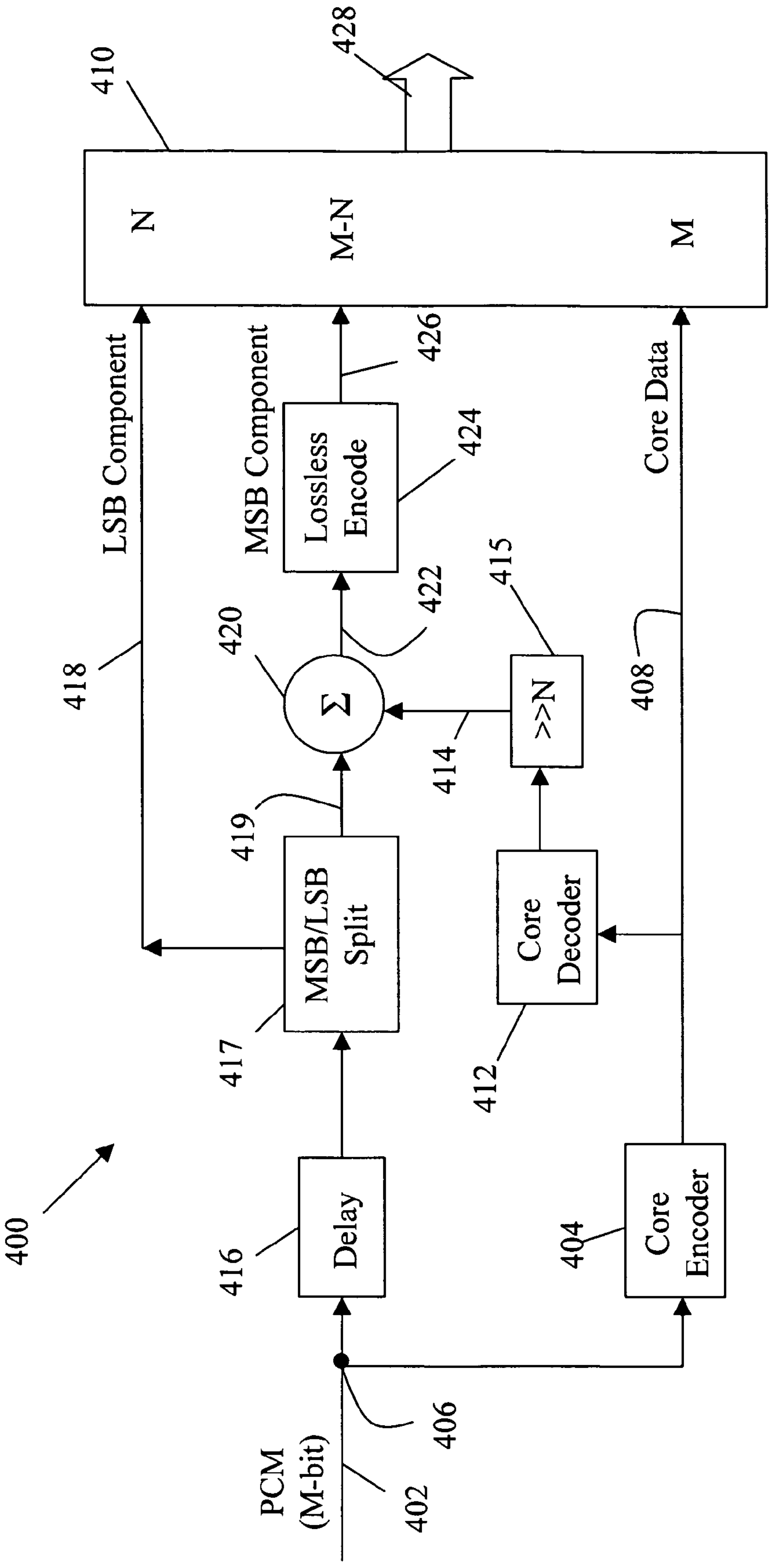
FIGS. 16*a* and 16*b* are block diagrams of the encoder and decoder for a scalable lossless codec that is backwards compatible with a lossy core encoder.

FIG. 16*a* shows a system level view of a scalable backward compatible encoder 400. A digitized audio signal, suitably M-bit PCM audio samples, is provided at input 402. Preferably, the digitized audio signal has a sampling rate and bandwidth which exceeds that of a modified, lossy core encoder 404. In one embodiment, the sampling rate of the digitized audio signal is 96 kHz (corresponding to a bandwidth of 48 kHz for the sampled audio). It should also be understood that the input audio may be, and preferably is, a multichannel signal wherein each channel is sampled at 96 kHz. The discussion which follows will concentrate on the processing of a single channel, but the extension to multiple channels is straightforward. The input signal is duplicated at node 406 and handled in parallel branches. In a first branch of the signal path, a modified lossy, wideband encoder 404 encodes the signal. The modified core encoder 404, which is described in detail below, produces an encoded data stream (corestream 408) which is conveyed to a packer or multiplexer 410. The corestream 408 is also communicated to a modified corestream decoder 412, which produces as output a modified, reconstructed core signal 414, which is right shifted by N bits (>>N 415) to discard its N lsbs.

Meanwhile, the input digitized audio signal 402 in the parallel path undergoes a compensating delay 416, substantially equal to the delay introduced into the reconstructed audio stream (by modified encode and modified decoders), to produce a delayed digitized audio stream. The audio stream is split into MSB and LSB portions 417 as described above. The N-bit LSB portion 418 is conveyed to the packer 410. The M-N bit reconstructed core signal 414, which was shifted to align with the MSB portion, is subtracted from the MSB portion of the delayed digitized audio stream 419 at subtracting node 420. (Note that a summing node could be substituted for a subtracting node, by changing the polarity of one of the inputs. Thus, summing and subtracting may be substantially equivalent for this purpose).

Subtracting node 420 produces a difference signal 422 which represents the difference between the M-N MSBs of the original signal and the reconstructed core signal. To accomplish purely "lossless" encoding, it is necessary to encode and transmit the difference signal with lossless encoding techniques. Accordingly, the M-N bit difference signal 422 is encoded with a lossless encoder 424, and the encoded M-N bit signal 426 packed or multiplexed with the core stream 408 in packer 410 to produce a multiplexed output bitstream 428. Note that the lossless coding produced coded lossless streams 418 and 426 which are at a variable bit rate, to accommodate the needs of the lossless coder. The packed stream is then optionally subjected to further layers of coding including channel coding, and then transmitted or recorded. Note that for purposes of this disclosure, recording may be considered as transmission through a channel.

The core encoder 404 is described as "modified" because in an embodiment capable of handling extended bandwidth the core encoder would require modification. A 64-band analysis filter bank within the encoder discards half of its output data and encodes only the lower 32 frequency bands. This discarded information is of no concern to legacy decoders that would be unable to reconstruct the upper half of the signal spectrum in any case. The remaining information is encoded as per the unmodified encoder to form a backwards-compatible core output stream. However, in another embodiment operating at or below 48 kHz sampling rate, the core encoder could be a substantially unmodified version of a prior core encoder. Similarly, for operation above the sampling rate of legacy decoders, the core decoder 412 would need to be modified as described below. For operation at conventional sampling rate (e.g., 48 kHz and below) the core decoder could be a substantially unmodified version of a prior core decoder or equivalent. In some embodiments the choice of sampling rate could be made at the time of encoding, and the encode and decode modules reconfigured at that time by software as desired.

Figure 16B:
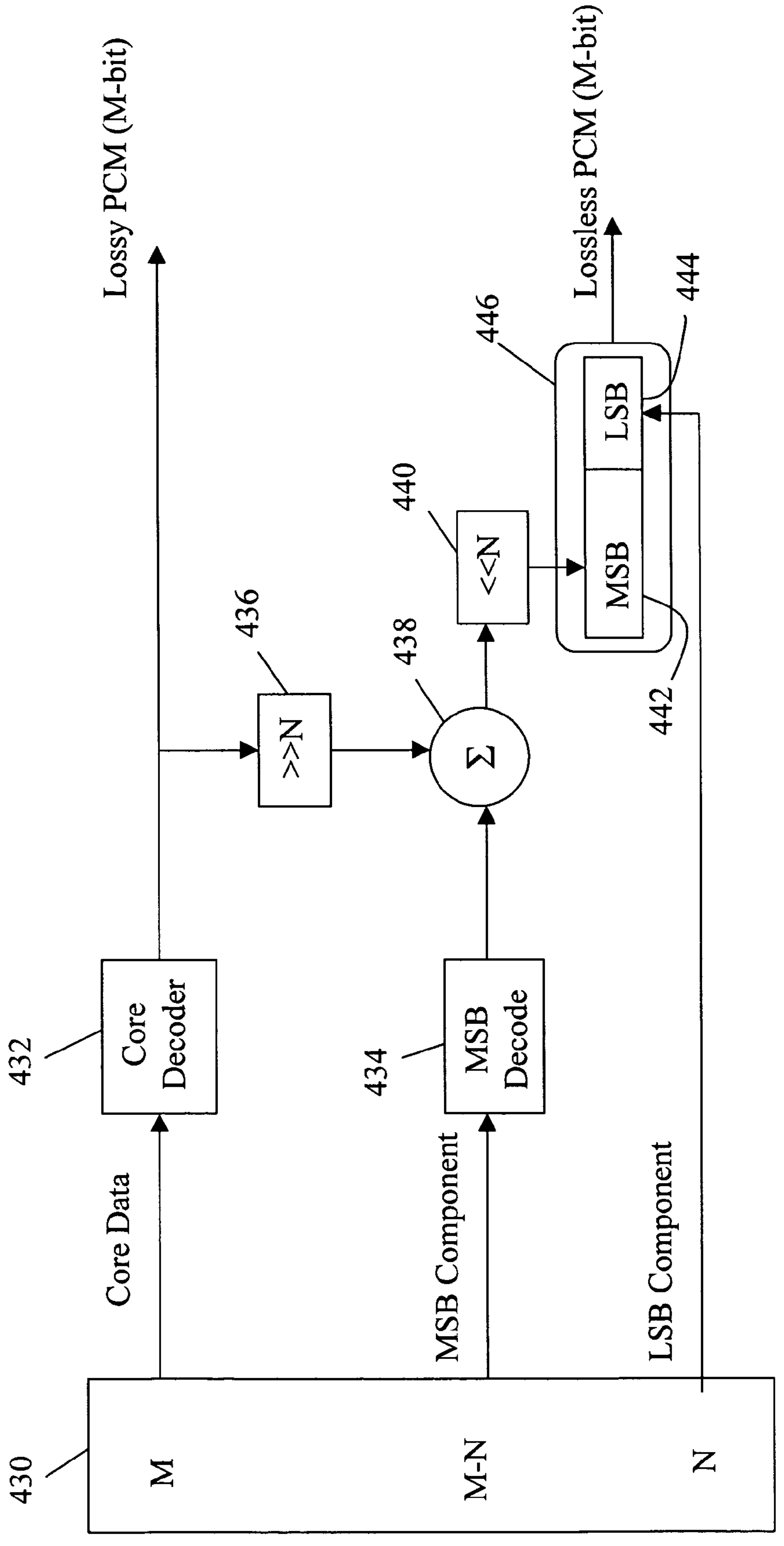

As shown in FIG. 16*b*, the method of decoding is complementary to the method of encoding. A prior generation decoder can decode the lossy core audio signal by simply decoding the corestream 408 and discarding the lossless MSB and LSB portions. The quality of audio produced in such a prior generation decoder will be extremely good, equivalent to prior generation audio, just not lossless.

Referring now to FIG. 16*b*, the incoming bitstream (recovered from either a transmission channel or a recording medium) is first unpacked in unpacker 430, which separates the corestream 408 from lossless extension data streams 418 (LSB) and 426 (MSB). The core stream is decoded by a modified core decoder 432, which reconstructs the core stream by zeroing out the un-transmitted sub-band samples for the upper 32 bands in a 64-band synthesis during reconstruction. (Note, if a standard core encode was performed, the zeroing out is unnecessary). The MSB extension field is decoded by a lossless MSB decoder 434. Because the LSB data was losslessly encoded using bit replication no decoding is necessary.

After decoding core and lossless MSB extensions in parallel, with the interpolated core reconstructed data is right shifted by N bits 436 and combined with the lossless portion of the data by adding in summer 438. The summed output is left shifted by N bits 440 to form the lossless MSB portion 442 and assembled with the N-bit LSB portion 444, to produce a PCM data word 446 that is a lossless, reconstructed representation of the original audio signal 402.

Because the signal was encoded by subtracting a decoded, lossy reconstruction from the exact input signal, the reconstructed signal represents an exact reconstruction of the original audio data. Thus, paradoxically, the combination of a lossy codec and a losslessly coded signal actually performs as a pure lossless codec, but with the additional advantage that the encoded data remains compatible with prior generation, lossless decoders. Furthermore, the bitstream can be scaled by selectively discarding LSBs to make it conform to media bit rate constraints and buffer capacity.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A method of decoding an audio bitstream, comprising:

receiving a bitstream as a sequence of analysis windows comprising header information including a least significant bit (LSB) bit width and an LSB bit width reduction and audio data including losslessly encoded most significant bit (MSB) portions and either losslessly encoded or scaled LSB portions so that a buffered payload of each analysis window is within an allowed payload;

extracting the LSB bit width and the LSB bit width reduction for each analysis window;

extracting the losslessly encoded MSB portions and decoding them into PCM audio data;

extracting either the losslessly encoded or scaled LSB portions and decoding them into PCM audio data;

assembling the MSB and LSB portions for each PCM audio sample;

using the LSB bit width and LSB bit width reduction to translate the assembled PCM audio data to an original bit width word; and outputting the PCM audio data for each analysis window.

2. The method of claim 1, wherein the losslessly encoded and scaled LSB portions are decoded by bit replication.

3. A decoder chip configured to receive a bitstream and output PCM audio data, said chip configured to execute the steps of:

extracting an LSB bit width and an LSB bit width reduction for each analysis window in the bitstream;

extracting losslessly encoded MSB portions and decoding them into PCM audio data;

extracting either losslessly encoded or scaled LSB portions and decoding them into PCM audio data;

assembling the MSB and LSB portions for each PCM audio sample;

using the LSB bit width and LSB bit width reduction to translate the assembled PCM audio data to an original bit width word; and outputting the PCM audio data for each analysis window.

4. An audio decoder, comprising:

a controller for reading encoded audio data from a bitstream on a media;

a buffer for buffering a plurality of analysis windows of the encoded audio data; and a DSP chip for decoding the encoded audio data and outputting PCM audio data for each successive analysis window, said DSP chip configured to decode analysis windows comprising header information including LSB bit widths and LSB bit width reductions and audio data including losslessly encoded MSB portions and losslessly encoded or scaled LSB portions, wherein the buffered payload does not exceed an allowed payload determined by the peak bit rate supported by the media and the capacity of the buffer.

5. The audio decoder of claim 4, wherein the DSP chip executes the steps of:

extracting the LSB bit width and the LSB bit width reduction for each analysis window in the bitstream;

extracting the losslessly encoded MSB portions and decoding them into PCM audio data;

extracting either the losslessly encoded or the scaled LSB portions and decoding them into PCM audio data;

assembling the MSB and LSB portions for each PCM audio sample;

using the LSB bit width and LSB bit width reduction to translate the assembled

PCM audio data to an original bit width word; and outputting the PCM audio data for each analysis window.

* * * * *